United States Patent [19]
Shiga

[11] Patent Number: 5,416,660
[45] Date of Patent: May 16, 1995

[54] PACKAGE FOR MICROWAVE DEVICE

[75] Inventor: Nobuo Shiga, Kanagawa, Japan

[73] Assignee: Sumitomo Electric Industries, Ltd., Osaka, Japan

[21] Appl. No.: 8,094

[22] Filed: Jan. 22, 1993

[30] Foreign Application Priority Data

Jan. 24, 1992 [JP] Japan .................................. 4-011089

[51] Int. Cl.⁶ .............................................. H02H 3/22
[52] U.S. Cl. ...................... 361/111; 361/56; 361/117
[58] Field of Search ............ 174/35 R; 361/119, 111, 361/117, 393, 220, 56, 58, 393, 772, 752, 783

[56] References Cited

U.S. PATENT DOCUMENTS

| | | | |
|---|---|---|---|
| 4,455,448 | 6/1984 | Bertolina | 174/35 R |
| 4,455,586 | 6/1984 | McCartney | 361/56 |
| 4,930,044 | 5/1990 | Eda et al. | 361/313 |

FOREIGN PATENT DOCUMENTS

| | | |
|---|---|---|
| 0157505 | 10/1985 | European Pat. Off. |
| 0337485 | 10/1989 | European Pat. Off. |
| 0457985 | 11/1991 | European Pat. Off. |

OTHER PUBLICATIONS

Patent Abstracts of Japan, vol. 15, No. 490, (1144) Dec. 11, 1991 & JP-A-32 14 632 (Fujitsu Ltd.) Sep. 29, 1991.
Patent Abstracts of Japan, vol. 12, No. 153 (607) May 11, 1988 & JP-A-62 269 366 (Toshiba Corp.) Nov. 11, 1987.

*Primary Examiner*—A. D. Pellinen
*Assistant Examiner*—Sally C. Medley
*Attorney, Agent, or Firm*—Cushman Darby & Cushman

[57] ABSTRACT

A package has two microwave input terminals to which a protection circuit for protecting a microwave device from electrostatic breakdown is connected and another microwave input terminal to which no protection circuit is connected. The protection circuit includes a microstrip line having a length equal to a quarter wavelength at the frequency of a signal to be amplified and a diode having one terminal connected to the microstrip line and the other terminal grounded.

5 Claims, 3 Drawing Sheets

PACKAGE FOR MICROWAVE DEVICE

BACKGROUND OF THE INVENTION

The present invention relates to a package for a microwave device used, for instance, in ground-based receivers for receiving a microwave signal transmitted from a communication satellite, broadcast satellite, etc.

Schottky-barrier-type field-effect transistors (MESFETs) employing a compound semiconductor such as GaAs are now in practical use as high-frequency FETs. Although GaAs FETs are advantageous as they have a low-noise characteristic even at extremely high frequencies such as microwave frequencies, they have a disadvantage of being prone to electrostatic breakdown compared to devices using a silicon semiconductor. Particularly in the case of low-noise amplifiers, where the noise figure is the most dominant factor, it becomes difficult to incorporate the function of a protection circuit into practical low-noise amplifiers as the addition of such a circuit may deteriorate the noise figure.

On the other hand, planar antennas are now increasingly employed as ground-based antennas for receiving a microwave signal transmitted from a communication satellite and a broadcast satellite. The planar antenna is constructed such that a large number of antenna elements are arranged on a plane and electromagnetic signals received by the respective antenna elements are collected by conductive wires. An antenna pattern is printed on a film, which is interposed between insulators. Therefore, the planar antenna is charged with much electricity.

As is understood from the above, if a receiver system employing GaAs FETs is directly connected to a planar antenna, the static electricity stored in the antenna may destruct the receiver system.

As a countermeasure against the above problem, a receiver circuit, a protection circuit and a quarter-wave line for isolating these circuits at high frequencies may be integrated on an IC chip. However, this will inevitably increase the chip size, which is disadvantageous in costs. Further, since the protection circuit is not required in many cases, an IC manufacturer needs to provide both a process for incorporating the protection circuit and a process not involving the protection circuit. Therefore, the cost reduction due to the IC mass-production effect is not expected.

SUMMARY OF THE INVENTION

An object of the present invention is to provide a package for a microwave device which can accommodate both cases of requiring and not requiring a protection circuit.

According to the invention, a package in which a microwave device is to be mounted comprises:
- a protection circuit for protecting the microwave device from electrostatic breakdown; and
- at least two microwave input terminals, one of the at least two input terminals being connected to the protection circuit. It is preferred that the protection circuit comprise a microstrip line having a length equal to a quarter wavelength on a substrate being used at the frequency of a signal to be amplified, and a diode having one terminal connected to the microstrip line and the other terminal grounded.

With the above constitution, since the package has both of the input terminal to which the protection circuit is connected and the input terminal to which no protection circuit is connected, one of the two input terminal may be used selectively at the time of mounting the microwave device.

DESCRIPTION OF THE PREFERRED EMBODIMENTS

Figure 1:
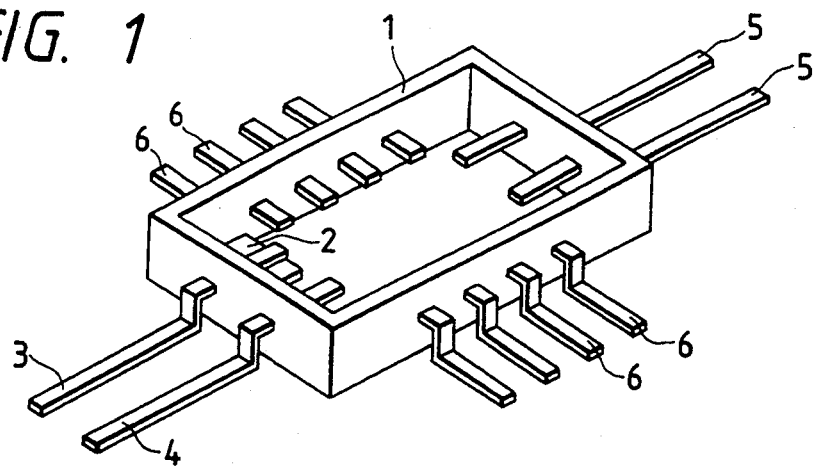
FIG. 1 is a perspective view of a package for a microwave device according to an embodiment of the present invention.

Several embodiments of the present invention are described hereinafter with reference to the accompanying drawings. Identical parts are given the same reference numerals in the drawings, and any redundant description are omitted.

FIG. 1 is a perspective view showing a package for a microwave device according to an embodiment of the invention. Input terminals 3, 4, output terminals 5 and power supply terminals 6 are inserted into side walls of a casing 1 of the package. A protection circuit 2 for protecting the microwave device from electrostatic breakdown is connected to the input terminal 3, but no protection circuit is connected to the input terminal 4.

Figure 2A:
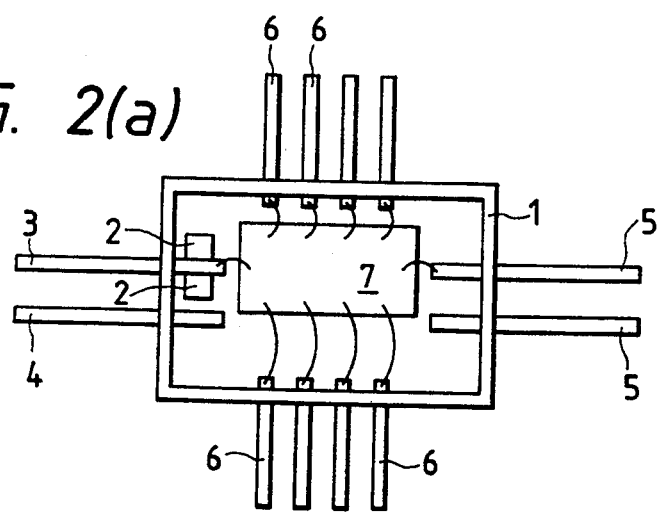
FIGS. 2(a) and 2(b) are top views of the microwave device packages in which an IC is mounted.
Figure 2B:
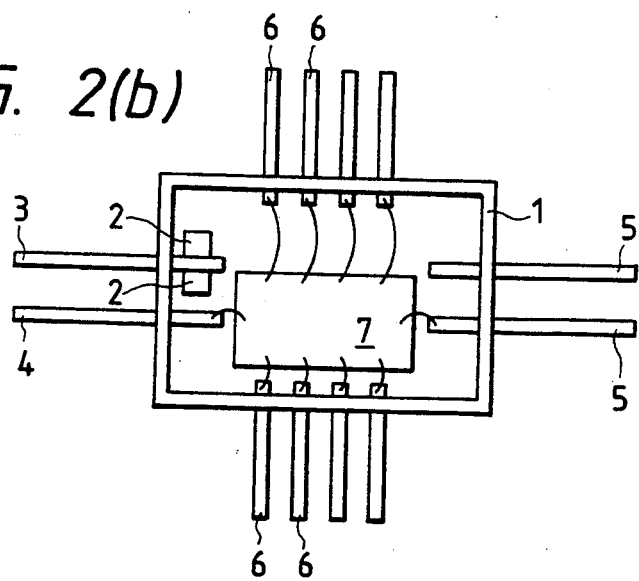

FIGS. 2(a) and 2(b) are top views showing microwave device packages in which an IC is mounted. FIG. 2(a) shows a case in which an IC 7 is wire-bonded to the input terminal 3 to which the protection circuit 2 is connected. FIG. 2(b) shows a case in which the IC 7 is wire-bonded to the input terminal 4 to which the protection circuit 2 is not connected.

Since the protection circuit causes a loss in the signal component, from the viewpoint of signal amplification it is best to avoid the use of the protection circuit. However, since the planar antenna is charged with much electricity, it is necessary to protect the microwave device from electrostatic breakdown. On the other hand, the protection circuit is not required when the microwave device is connected to the antenna via a waveguide etc.

As shown in FIGS. 2(a) and 2(b), the package of this embodiment can accommodate both cases requiring and not requiring the protection circuit 2 by simply selecting between the input terminals 3, 4 without the need of changing the packages. That is, it is not necessary to prepare both types of packages, wherein one includes the protection circuit and one does not. Therefore, the package of this embodiment can accommodate a wider variety of cases, and can realize cost reduction when mass produced.

Figure 3:
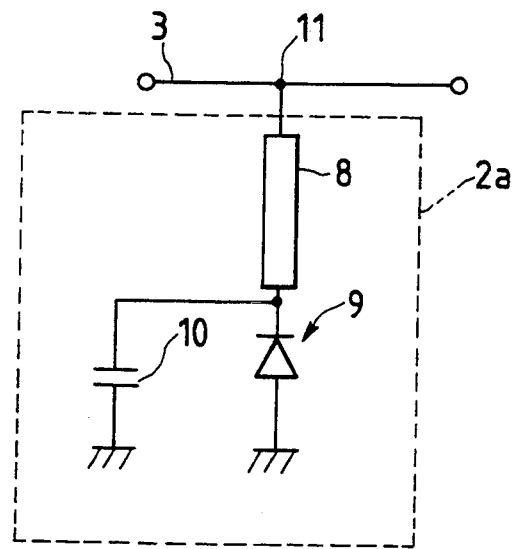
FIGS. 3-7 show protection circuits according to embodiments of the invention, respectively.

Referring to FIG. 3, a protection circuit 2a according to an embodiment of the invention is described. The protection circuit 2a consists of a microstrip line 8, a diode 9 and a capacitor 10. The microstrip line 8, whose one end is connected to the input terminal 3, has a length equal to a quarter wavelength at the frequency of a signal to be amplified. The actual quarter wavelength on the substrate depends on the material and thickness of the substrate and other factors. The anode of the diode 9 is connected to the other end of the microstrip line 8. For example, the diode 9 may be constructed by short-circuiting the drain and source terminals of a MESFET, in which case the gate of the FET serves as the anode. The cathode of the diode 9 (in the above construction, the terminal commonly connected to the drain and source terminals of the MESFET) is grounded.

Figure 4:
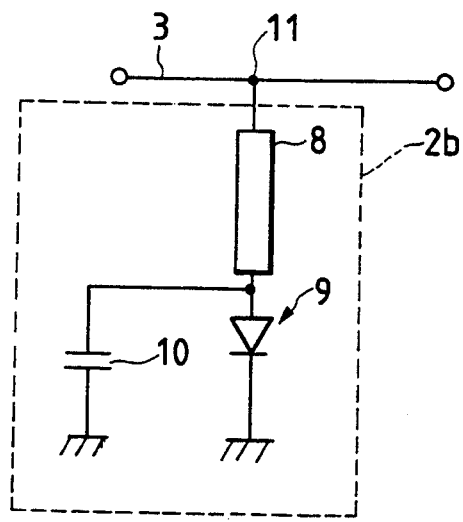

The capacitor 10 is connected to the diode 9 in parallel. The capacitance of the capacitor 10 is set so as to take a sufficiently small impedance value at the frequency of the signal to be amplified. Therefore, at that frequency, the end of the microstrip line 8 on the side of the capacitor 10 is nearly short-circuited, and the impedance at a connection point 11 located a quarter wavelength upstream thereof is close to an infinite value. Conversely, if the capacitance of the capacitor 10 is set so as not to take a sufficiently small value at the frequency of the signal to be amplified, the impedance at that frequency looking toward the protection circuit 2a from the connection point 11 is not large enough to provide a state where the existence of the protection circuit 2a can be neglected, deteriorating the noise characteristics. Where the impedance looking toward the protection circuit 2a from the connection point 11 at that frequency ideally takes an infinite value, the noise figure is deteriorated only by an amount corresponding to the transmission loss of the microstrip line 8.

Where the antenna connected to the input terminal 3 is charged oppositely to the case of FIG. 3, the diode 9 may be connected reversely, as shown in FIG. 4. The polarity of the electrification depends on the material of the antenna to be connected to the input terminal 3 and the environment, and the polarity of the diode 9 needs to be determined accordingly.

Figure 5:
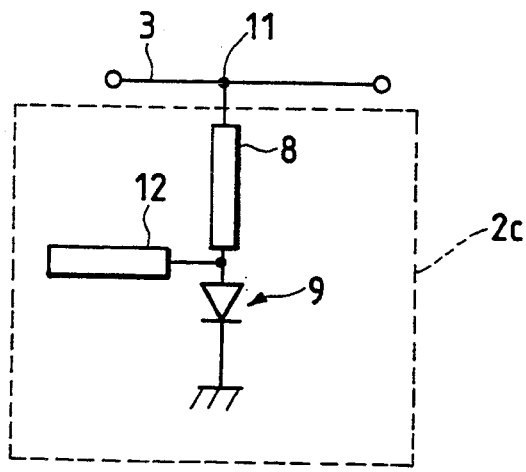

In the above embodiments, it is assumed that the capacitor 10 is of the MIM (metal-insulator-metal) type. Instead, as shown in FIG. 5, an open stub 12 having the same length as the microstrip line 8 may be employed. In the latter case, since the end of the stub 8 is opened, the impedance at the connection point 11 located a half wavelength upstream thereof becomes infinite.

Figure 6:
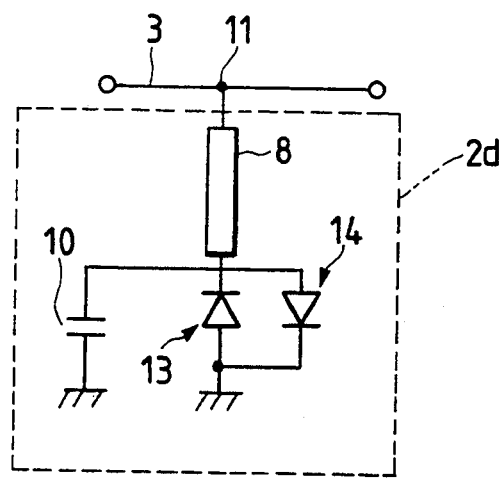

FIG. 6 shows a protection circuit 2d according to another embodiment, which can accommodate either polarity of the electrification of the antenna connected to the input terminal 3. The anode of a diode 13 is connected to the end of the microstrip line 8, and its cathode is grounded. Another diode 14 is connected to the diode 13 in parallel with opposite polarities. With this constitution, the charge of the antenna connected to the input terminal 3 can be removed irrespective of the polarity of the charge.

Figure 7:
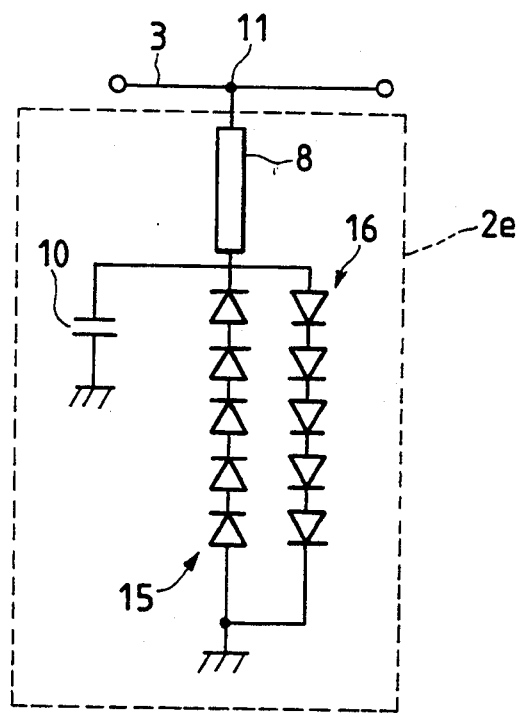

As shown in FIG. 7 illustrating a further embodiment, the number of diodes 15, 16 may be increased in the case where the diode breakdown voltage is insufficient. One instance would be when the bias point of the low-noise amplifier (not shown) is deeper than the forward voltage of the diode and a DC current to its input portion is not cut by a capacitor. That is, in this embodiment, the diodes 13 and 14 of the FIG. 6 embodiment are replaced by the series connections 15 and 16 of a plurality of diodes, respectively. It is noted that also in the embodiments of FIGS. 3–5, in which cases the diode is only in a single direction, the number of diodes may be increased for the same purpose as of the FIG. 7 embodiment.

As described above in detail, the package for a microwave device according to the invention has both an input terminal to which a protection circuit protects the microwave device from electrostatic breakdown, and an input terminal to which no protection circuit is connected. Therefore, the determination as to whether the protection circuit is necessary or not can be made at the time of mounting an IC in the package; that is, the package of the invention can accommodate either case. As a result, it is not necessary to line up one package with the protection circuit and one package without the protection circuit. The package of the invention can accommodate a wider variety of cases, and can realize cost reduction when mass-produced. Further, the invention can provide a higher degree of freedom in selecting the diode circuit to be used in the protection circuit, to facilitate the provision of the protection circuit having high performance.

What is claimed is:

1. A package in which a microwave device is to be mounted, said package comprising:
    a protection circuit for protecting said microwave device from electrostatic breakdown;
    a microstrip line having a length equal to a quarter wavelength at a frequency of an input signal, which is to be inputted to said microwave device;
    a first terminal connected to said microstrip line; and
    a capacitor connected between said microstrip line and a ground potential;
    a first input terminal connected to said protection circuit and first terminal; and
    a second input terminal; wherein one, and only one, of said first and second input terminals is selectively connected to said microwave device, thereby causing said protection circuit to be selectively connected to said microwave device.

2. The package of claim 1, wherein said protection circuit comprises:
    a diode;
    a second terminal connecting said diode to said microstrip line; and
    a third terminal connecting said diode to said ground potential.

3. A package in which a microwave device is to be mounted, said package comprising:
    a first input terminal;
    a second input terminal; and
    a protection circuit, connected to said first input terminal, for protecting said microwave device from electrostatic breakdown, said protection circuit comprising;
        a microstrip line having a length equal to a quarter wavelength at a frequency of an input signal, which is to be inputted to said microwave device;
        a terminal connecting said microstrip line to said first input terminal;
        a first diode having an anode connected to said microstrip line and a cathode connected to a ground potential; and
        a second diode having an anode connected to said ground potential and a cathode connected to said microstrip line; and
    wherein one, and only one, of said first and second input terminals is selectively connected to said microwave device, thereby causing said protection circuit to be selectively connected to said microwave device.

4. A package in which a microwave device is to be mounted, said package comprising:
    a first input terminal;
    a second input terminal; and a protection circuit for protecting said microwave device from electrostatic breakdown, said protection circuit comprising;
- a microstrip line having a length equal to a quarter wavelength at a frequency of an input signal, which is to be inputted to said microwave device;
- a terminal connecting said microstrip line to said first input terminal; and
- a series connection of a plurality of diodes, the series connection having a first end connected to said microstrip line and a second end connected to a ground potential; and wherein one, and only one, of said first and second input terminals is selectively connected to said microwave device, thereby causing said protection circuit to be selectively connected to said microwave device.

5. A package in which a microwave device is to be mounted, said package comprising:

a protection circuit for protecting said microwave device from electrostatic breakdown, the protection circuit comprising:
- a microstrip line having a length equal to a quarter wavelength at a frequency of an input signal, which is to be inputted to said microwave device;
- a first terminal connected to said microstrip line;
- a diode;
- a second terminal connecting said diode to said microstrip line;
- a third terminal connecting said diode to a ground potential; and
- an open stub connected to said second terminal and having a length equal to said quarter wavelength of said input signal; and at least two input terminals, one of said at least two input terminals being connected to said first terminal of said protection circuit, wherein said one of said at least two input terminals is selectively coupled to said microwave device, thereby causing said protection circuit to be selectively coupled to said microwave device.

* * * * *